United States Patent
Agrawal

(10) Patent No.: US 6,483,754 B1
(45) Date of Patent: Nov. 19, 2002

(54) SELF-TIME SCHEME TO REDUCE CYCLE TIME FOR MEMORIES

(75) Inventor: Ghasi R. Agrawal, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/859,268

(22) Filed: May 16, 2001

(51) Int. Cl.[7] .............................. G11C 16/04; G11C 7/02
(52) U.S. Cl. ................................ 365/189.04; 265/210
(58) Field of Search ........................... 365/189.04, 210, 365/212, 214, 230.06

(56) References Cited

U.S. PATENT DOCUMENTS 5,689,471 A * 11/1997 Voss et al. ................... 365/156
5,886,939 A *  3/1999 Choi et al. ................... 365/210
6,088,279 A *  7/2000 Ishii ............................. 365/210
6,252,814 B1 *  6/2001 Tran et al. ................... 365/210
6,388,931 B1 *  5/2002 Wilkins ....................... 365/194

* cited by examiner

Primary Examiner—Richard Elms
Assistant Examiner—Anh Phung
(74) Attorney, Agent, or Firm—Conley, Rose & Tayon

(57) ABSTRACT

A self-time circuit and method are presented for reducing the write cycle time in semiconductor memory. A "dummy" memory cell having the same timing requirements as the functional cells, and associated write logic are added to the standard circuitry of the memory device. The dummy write cell receives the same control signals used to write data to the functional cells of the memory, and is configured to issue a completion signal when a write access is concluded, causing the write cycle to be terminated. The circuit and method disclosed herein thus permit write cycle time to be reduced to the lowest practical value, independently of the read cycle time. This potentially increases the overall operating speed of the memory device. The circuit and method disclosed herein are adaptable to the most common types of memory devices, such as SRAM, DRAM and CAM.

10 Claims, 5 Drawing Sheets

SELF-TIME SCHEME TO REDUCE CYCLE TIME FOR MEMORIES

BACKGROUND OF THE INVENTION

1. Field of Invention

This invention relates to semiconductor memory and, more particularly, to performance enhancement of semiconductor memory by using a self-time mechanism to selectively reduce a write interval and power consumption associated therewith.

2. Description of Related Art

Semiconductor memory is a crucial resource in modem computers, being used for data storage and program execution. With the exception of the central processor itself, no other component within the computer experiences as high a level of activity. Traditional trends in memory technology are toward greater density (more memory locations, or "cells," per memory device), higher speed and improved efficiency. To some extent, these goals are inconsistent. For example, as memory speed increases, power consumption generally also rises.

There are various types of semiconductor memory, including Read Only Memory (ROM) and Random Access Memory (RAM). ROM is typically used where instructions or data must not be modified, while RAM is used to store instructions or data which must not only be read, but modified. ROM is a form of non-volatile storage—i.e., the information stored in ROM persists even after power is removed from the memory. On the other hand, RAM storage is generally volatile, and must remain powered-up in order to preserve its contents.

A conventional semiconductor memory device stores information digitally, in the form of bits (i.e., binary digits). The memory is typically organized as a matrix or array of memory cells, each of which is capable of storing one bit. The cells of the memory matrix are accessed by word lines and bit lines. Word lines are typically associated with the rows of the memory matrix, and bit lines with the columns. Raising a word line activates a given row; the bit lines are then used to read from or write to the corresponding cells in the currently active row. Memory cells are typically capable of assuming one of two voltage states (commonly described as "on" or "off"). Information is stored in the memory by setting each cell in the appropriate logic state. For example, to store a bit having the value 1 in a particular cell, one would select the cell by activating the appropriate bit line and word line and then set the state of that cell to "on;" similarly, a 0 would be stored by setting the selected cell to the "off" state. Obviously, the association of "on" with 1 and "off" with 0 is arbitrary, and could be reversed.

The two major types of semiconductor RAM, Static Random Access Memory (SRAM) and Dynamic Random Access Memory (DRAM), differ in the manner by which their cells represent the state of a bit. In an SRAM, each memory cell includes transistor-based circuitry that implements a bi-stable latch. A bi-stable latch relies on transistor gain and positive (i.e. reinforcing) feedback to guarantee that it can only assume one of two states—"on" or "off". The latch is stable in either state (hence, the term "bi-stable"). It can be induced to change from one state to the other only through the application of an external stimulus. Left undisturbed, it will remain in its original state indefinitely. This is just the sort of operation required for an SRAM memory circuit, since once a bit value has been written to the memory cell, it will be retained until it is deliberately changed. Each memory cell may be accessed using a pair of complementary bit lines. The bit lines are driven, to write a new value into the cell, or read by a sense amplifier, to read out the current value. Prior to each access, the bit lines must be pre-charged to a prescribed logic level.

The entire time interval required to complete a read or write operation to an SRAM memory cell is termed the read/write cycle time. The read cycle time has two components; a read access interval and a read pre-charge interval. During the read access interval, the logic state of the cell is acquired by the associated sense amplifier. The pre-charge interval immediately follows the read access. During the pre-charge interval, the bit lines associated with the cell are pre-charged to prepare for the next read cycle. Similarly, a write cycle consists of a write access interval (during which the input data is transferred into the memory cell), followed by a write pre-charge interval. For most SRAM memory devices, the read and write cycle times are not equal. The read access time is typically longer than the write access time, while the write pre-charge time is generally longer than the read pre-charge time.

In contrast to the SRAM, the memory cells of a DRAM employ a capacitor to store the "on"/"off" voltage state representing the bit. A transistor-based buffer drives the capacitor. The buffer quickly charges or discharges the capacitor to change the state of the memory cell, and is then disconnected. The capacitor then temporarily holds the charge placed on it by the buffer and retains the stored voltage level.

DRAMs have at least two drawbacks compared to SRAMs. The first of these is that leakage currents within the semiconductor memory are unavoidable, and act to limit the length of time the memory cell capacitors can hold their charge. Consequently, DRAMs typically require a periodic refresh cycle to restore sagging capacitor voltage levels. Otherwise, the capacitive memory cells would not maintain their contents. Secondly, changing the state of a DRAM memory cell requires charging or discharging the cell capacitor. The time required to do this depends on the amount of current the transistor-based buffer can source or sink, but generally cannot be done as quickly as a bistable latch can change state. Therefore, DRAMs are typically slower than SRAMs. DRAMs offset these disadvantages by offering higher memory cell densities, since the capacitive memory cells are intrinsically smaller than the transistor-based latching cells of an SRAM.

SRAMs are widely used in applications where speed is of primary importance, such as the cache memory typically placed proximate to the processor or Central Processing Unit (CPU) in a personal computer. However, the timing of its internal circuitry may critically affect the speed and efficiency of the SRAM. For example, the bit line pre-charge interval comprises an appreciable portion of the read/write cycle time, and sense amplifier usage contributes significantly to the overall power consumption of the SRAM. In early SRAM memory designs, all read/write cycle timing was based on an externally generated clock signal. For example, if the SRAM were used in a microcomputer, the bus clock in the memory interface would determine the read/write timing characteristics of the SRAM.

Though conceptually simple, reliance on the bus clock results in excessive power consumption. One reason for this is that the sense amplifiers used to read the contents of each SRAM memory cell consume significant power while they are active. In the original approach described above, the sense amplifiers would remain active until the end of a memory cycle, as determined by the externally generated clock. In many cases, the sense amplifier would have completed its access of the respective cell before the end of the cycle, and would thus be maintained in an active state (consuming power) throughout a portion of the cycle when it was not serving any useful purpose.

To overcome the inefficiency of the above-described approach, SRAM manufacturers incorporated "self-time" circuitry into the internal SRAM circuitry, to control timing independently of the externally generated clock signal. The self-time circuitry establishes the interval allowed for reading or writing the contents of the memory locations, together with the subsequent pre-charge interval.

While this use of self-time circuitry improves efficiency, it is not an optimal solution. For simplicity, existing self-time schemes assign the same access and pre-charge times for both read and write memory accesses. Actually, this is a misrepresentation, since write access times are typically shorter than read access times, and write pre-charge times are generally longer than read pre-charge times. By forcing write cycle times to be longer than necessary, current self-time schemes may limit the speed of the SRAM and increase its power consumption.

It would be desirable to have a self-time circuit that applies different timing constraints for write accesses than for read accesses. Preferably, the improved self-time circuitry should be simple and easily adapted to conventional SRAM designs, and it use should not compromise the performance of the SRAM.

SUMMARY OF THE INVENTION

The use of self-time circuitry in memory devices can improve efficiency and speed, in comparison to straightforward schemes in which the timing of the memory's internal circuitry is derived solely from an external clock. However, conventional self-time schemes assign the same pre-charge time interval and the same cell access interval for both read and write memory accesses. This typical approach has some drawbacks. Although pre-charge and access times differ for read and write operations, the longer of the two intervals is imposed by the self-time circuitry for both operations. Therefore, in at least some cases, the cycle time is longer than necessary, effectively reducing the speed of the memory. In addition, maintaining sense amplifiers and related circuitry in an active state longer than necessary may add significantly to the average power consumption of the memory.

Disclosed herein is a circuit and method for reducing the write cycle time and isolating it from the read cycle to reduce overall cycle time in a semiconductor memory, which overcomes the above problems. In an embodiment of the circuit disclosed herein, a "dummy" memory cell receives the same control signals used to write data to the functional cells of the memory. Unlike the other memory cells, the dummy cell cannot be externally accessed for the storage or retrieval of data. Although not an accessible storage location, the dummy cell is preferably structured identically to the accessible memory cells, so that it has exactly the same timing requirements. The dummy cell is configured to change its logic state at the beginning of the write operation, which coincides with data being transferred into any of the accessible memory cells. Upon completion of the write operation, the dummy cell issues a completion signal. A clock controller within the memory device, upon receiving the completion signal, terminates the write cycle and returns the dummy cell to its original state. Since the dummy cell is situated at the end of the signal path for the control signals, its state cannot toggle before the data transfer to the functional cells has completed. Therefore, the completion signal will not occur until after a write operation to any of the functional memory cells has concluded. When the write cycle is terminated, the clock controller also deactivates the clock signal to the memory device (to reduce power consumption), and initiates pre-charging of the bit lines (to prepare the memory cells for the next read/write operation).

The novel self-time circuit disclosed herein is adaptable to the most common types of memory devices, such as SRAM, DRAM and CAM. In certain situations, read and write operations may take place simultaneously. This may occur, for example, with memory accesses performed by a microcontroller capable of independent input/output pin assignments. If applied in a memory device allowing simultaneous reads and writes, the present circuit may be used in conjunction with conventional self-time circuitry, which typically is based on the read access time. Simple logic can be employed to ensure that the cycle time for a concurrent read/write operation is the longer of the read access time and the write access time.

A method for reducing the write cycle time in a semiconductor memory is also disclosed herein. According to the method, data are transferred into functional memory cells at the start of the write interval, while a concurrent state change is induced in a dummy memory cell. Once the state change is latched in the dummy cell, a completion signal is issued. Upon detecting the completion signal, the write interval is terminated and the dummy write cell reset to its original logic state by a clock controller. Upon terminating the write interval, the clock controller may also deactivate the memory clock and initiate bit line pre-charging. The method also includes locating the dummy write cell at the end of the signal path used to write data into the functional cells, so that the state change in the dummy write cell does not occur until after the data transfer into the functional cells has completed.

Advantageously, the circuit disclosed herein allows write cycle time to be reduced to the lowest practical value, independently of the read cycle time. This increases the overall operating speed of the memory device.

BRIEF DESCRIPTION OF THE DRAWINGS

Other objects and advantages of the invention will become apparent upon reading the following detailed description and upon reference to the accompanying drawings in which.

Figure 1:
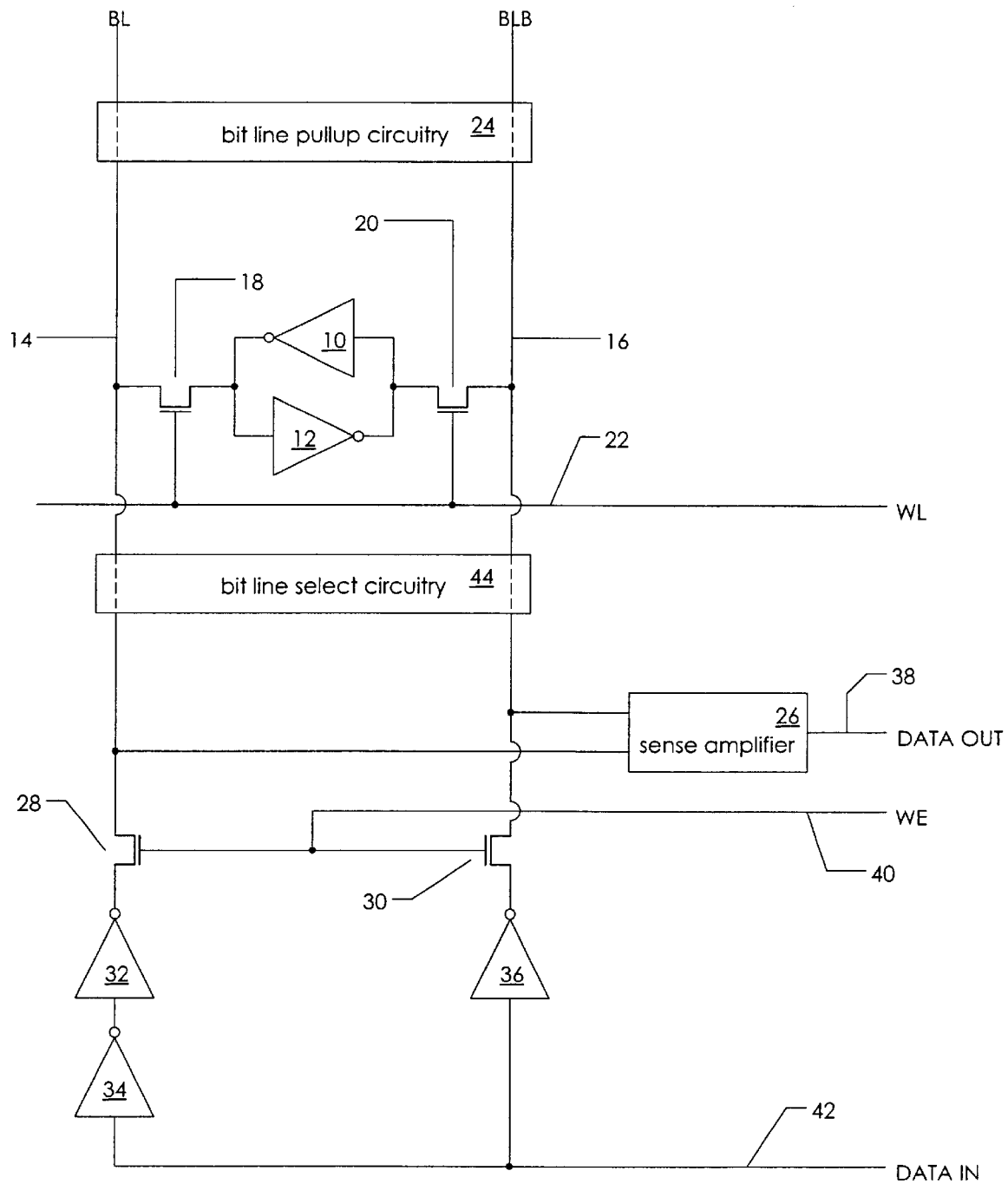
FIG. 1 represents the functional structure of a typical SRAM memory cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Semiconductor memories are among the most pervasive electronic components, finding use in products ranging from answering machines to supercomputers. In many applications, memory performance is extremely important, and there is continuing effort to improve the performance of these devices. A semiconductor memory, as discussed herein, is comprised of a matrix of storage locations, or "cells", along with the associated logic to address specific storage locations, and to write/read data to/from those locations. Typically, the interface to the memory device contains data and address lines, various control signals and a data clock.

SRAM is a widely used type of semiconductor memory, having a simple interface and capable of high-speed operation. These memories are commonly employed where fast memory access is necessary (such as in computer caches) or in embedded applications, where the complexity of a DRAM memory interface is unwarranted. The functional structure of a typical SRAM memory cell is shown in FIG. 1.

In FIG. 1, cross-coupled inverters 10 and 12 comprise a bi-stable latch, which may be formed from cross-coupled transistor pairs. It will be seen that the output of each inverter provides positive feedback to the input of the other. For example, if the input of inverter 10 goes high, its output goes low. This drives the input of inverter 12 low, reinforcing the high at the input of inverter 10. As a result, the latch is capable of retaining a logic state, enabling it to serve as a somewhat permanent, or static, storage element. The logic state of the latch is brought out to a pair of complementary bit lines BL 14 and BLB 16. Bit lines 14 and 16 are controlled by word line (WL) 22 via a pair of pass transistors 18 and 20. When word line 22 is low, the pass transistors are turned off, isolating the latch. When word line 22 is high, pass transistor 18 connects the output of inverter 10 to bit line BL 14; likewise, pass transistor 20 connects the output of inverter 12 to bit line BLB 16. Additional circuitry is also associated with the bit lines for selection 44 and pull-up 24 functions.

During read operations, the write enable (WE) signal 40 is low. This disables pass transistors 28 and 30, effectively disconnecting inverting buffer amplifiers 32, 34 and 36 from the rest of the circuitry. In order to read the cell, the voltage difference between the two complementary bit lines 14 and 16 is buffered by a differential sense amplifier 26 to appear as a 1 or a 0 at the data output 38. Although it requires more circuitry than directly sensing a single bit line, this differential to single-ended voltage conversion provides very high noise immunity. During write operations, WE 40 goes high, allowing pass transistor 28 to connect inverting drivers 32 and 34 to bit line BL 14; similarly, pass transistor 30 connects inverting driver 36 to complementary bit line BLB 16. The inverting drivers buffer the logic state on data input 42 and store this state in the bi-stable latch by overriding the inverters 10 and 12. Assume, for example, that the output of inverter 10 is high, that write enable line 40 is high, and that the data input 42 is low. Drivers 32 and 34, connected through pass transistors 28 and 18, will overcome inverter 10, pulling it low and changing the state of the latch. Once this has been accomplished, pass transistors 18 and 20 may be turned off, and the latch retains the new state by virtue of positive feedback, as described above.

During a memory read or write cycle, the memory access (i.e., the actual transfer of data into or out of the memory cell) is preceded by a pre-charge interval. When the address of a given memory cell is selected, prior to reading or writing to the cell, complementary bit lines BL 14 and BLB 16 must be pre-charged. This permits the cell logic to establish a logic low state by pulling down either BL 14 or BLB 16. The pre-charge interval differs for read and write operations. During a write cycle, the bit line is pre-charged to the full voltage rails of the memory device. Consequently, pre-charge takes longer for a write than for a read. On the other hand, the time required to write data to a memory cell is generally less than the time required to read the cell. Therefore, the write access interval comprises a smaller portion of the total memory cycle time than does the read access interval. The relationship of these intervals is represented in FIG. 2a.

Figure 2A:
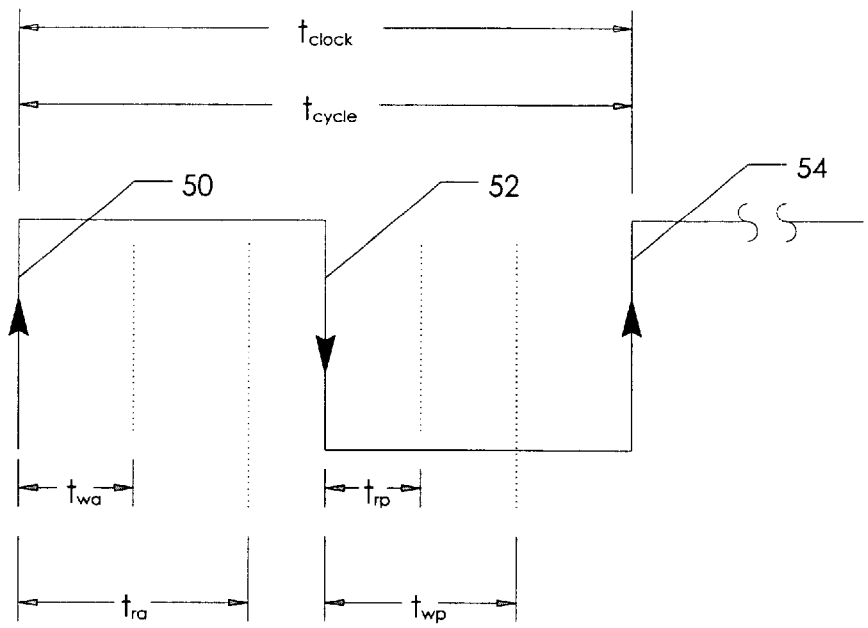
FIGS. 2a and 2b illustrate read and write memory access cycles, corresponding to clock-driven timing and conventional self-time circuitry.

FIG. 2a shows one entire memory cycle tcycle, beginning with the first rising edge 50 of the memory clock and ending with the second rising edge 54. The write access twa or read access $t_{ra}$ takes place during the first half of the memory cycle; it can be seen that the read access time is longer. The pre-charge interval for the next memory access occurs during the second half of the current memory access, following the falling edge of the clock 52. As shown, the pre-charge interval for a read $t_{rp}$ is typically shorter than that for a write $t_{wp}$.

A simple scheme for handling memory reads and writes would be to allow read or write accesses to continue until the falling edge 52 of the clock, and to pre-charge until the next rising edge 54. In this case, as shown in FIG. 2a, the memory cycle $t_{cycle}$ would be identical to the clock cycle $t_{clock}$. Unfortunately, this would not be very efficient. As described above, during a read operation, the logic state of the memory cell is buffered by differential sense amplifier 26. The sense amplifier is a high-speed circuit, consuming significant operating current. If the read access time were allowed to extend through the entire first half of the memory clock cycle, the sense amplifier would be active longer than necessary, resulting in excessive power consumption. Note that this problem would be especially severe at slower memory clock rates. Therefore, as a means of reducing power consumption, the sense amplifier is often deactivated when not in use. As discussed above, self-time circuitry within the memory device deactivates the sense amplifier after a prescribed interval, independently of the memory clock.

Figure 2B:
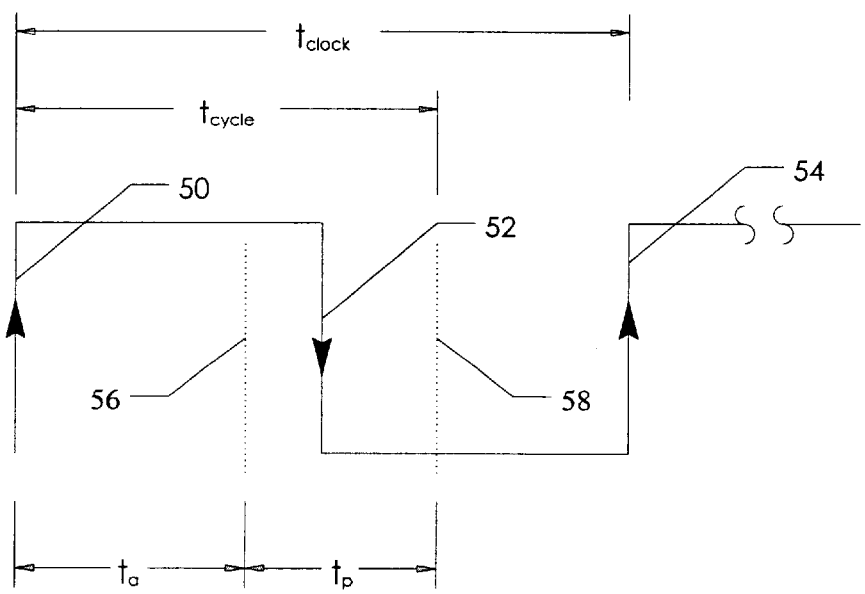

The conventional self-time scheme uses the same access interval for both read and write accesses. This hardware-based time period must be long enough to guarantee that all reads and writes can be completed. Therefore, the common access interval of the self-time circuit is based on the read access time, since it is generally longer than the write access time. Similarly, the conventional self-time circuit uses a single pre-charge interval for both read and write memory accesses. The pre-charge time assigned by the self-time circuit is based on the write pre-charge interval, since it is generally longer than the read pre-charge interval. The memory access cycle corresponding to a conventional self-time circuit is illustrated in FIG. 2b.

For reference, the rising and falling edges of the memory clock 50–54 are shown, as in FIG. 2a. In FIG. 2b, however, the memory access cycle $t_{cycle}$ is comprised of an access interval $t_a$ 56, followed by a pre-charge interval $t_p$ 58. Note that $t_a$ and $t_p$ are the same for both read and write accesses. The cumulative $t_a$ and $t_p$ time period represents the sum of the longer access period and the longer pre-charge period. Therefore, the cumulative $t_{cycle}$ is equal to $t_{ra}$ plus $t_{wp}$. Note also, that $t_{cycle}$ is appreciably shorter than the period of the memory clock (i.e., the interval between the first rising edge 50 and the second rising edge 54 of the memory clock). Advantageously, this allows the clock cycle $t_{cycle}$ to be shortened to permit faster operation of the memory device (as long as $t_{clock} \geq t_{cycle}$). As this timing diagram shows, sense amplifier power consumption does not worsen at slower clock rates, since the sense amplifier is deactivated by the self-time circuit after $t_a$, independently of the memory clock.

Although it is an improvement over the simple clock-driven timing scheme, conventional self-time circuitry does not yield the optimum speed obtainable from the memory device. This is because it uses a single access time interval for both reads and writes, despite the fact that write accesses can generally be accomplished more quickly than reads. Similarly, it imposes a single pre-charge interval for both reads and writes, even though reads typically require a shorter pre-charge interval than writes.

For example, assume that a given SRAM requires 1.5 ns to write to and 3.0 ns to read from any memory location. Further assume that write operations require 1.5 ns and reads require 0.5 ns to pre-charge the bit lines. The best possible read and write cycle times would then be:

| pre-charge time | access time | | |
|---|---|---|---|
| 0.5 ns | 3.0 ns | = | 4.0 ns read cycle time |
| 1.5 ns | 1.5 ns | = | 3.0 ns write cycle time |

However, if a conventional self-time scheme is used, the longer pre-charge time and the longer access time will be used for both reads and writes. This results in both the read cycle time and write cycle time being 1.5 ns+3.0 ns=4.5 ns. Thus, using the conventional self-time scheme may preclude highest-speed operation of the memory. This is a significant disadvantage, in view of demands for ever-increasing levels of performance from semiconductor memory.

The disparity between the read and write cycle time can be dealt with by dividing bit lines into numerous short segments, thereby decreasing the path length of each bit line. A shorter path length for a trace conductor will lessen the capacitive coupling between bit lines, and thereby increase the bit line responsiveness. Since driving the bit line to the rails during a pre-charge interval preceding a write access constitutes a significant delay, shortening the bit lines will reduce the pre-charge time for write accesses, thus making the read and write cycle times more nearly equal. However, this strategy may consume an unacceptable portion of the available semiconductor die area, leaving comparatively less room for memory cells.

The novel self-time circuit and method disclosed herein are believed to improve write cycle timing, and potentially increase the operating speed of a memory device embodying said circuit and method. The approach taken is to establish write timing by means of a dummy write cell. Although not an actual storage location, the dummy write cell contains the same circuit components and configuration as the usable memory cells and therefore has the same timing characteristics. The dummy write cell is strategically placed at the end of the signal path interconnecting the functional memory cells, delaying its response relative to the other, usable memory cells. This is done intentionally, so the dummy write cell will not complete a memory access until the usable (functional) memory locations have done so. Thus, the dummy write cell serves as a "done" indicator for memory write operations.

Figure 3:
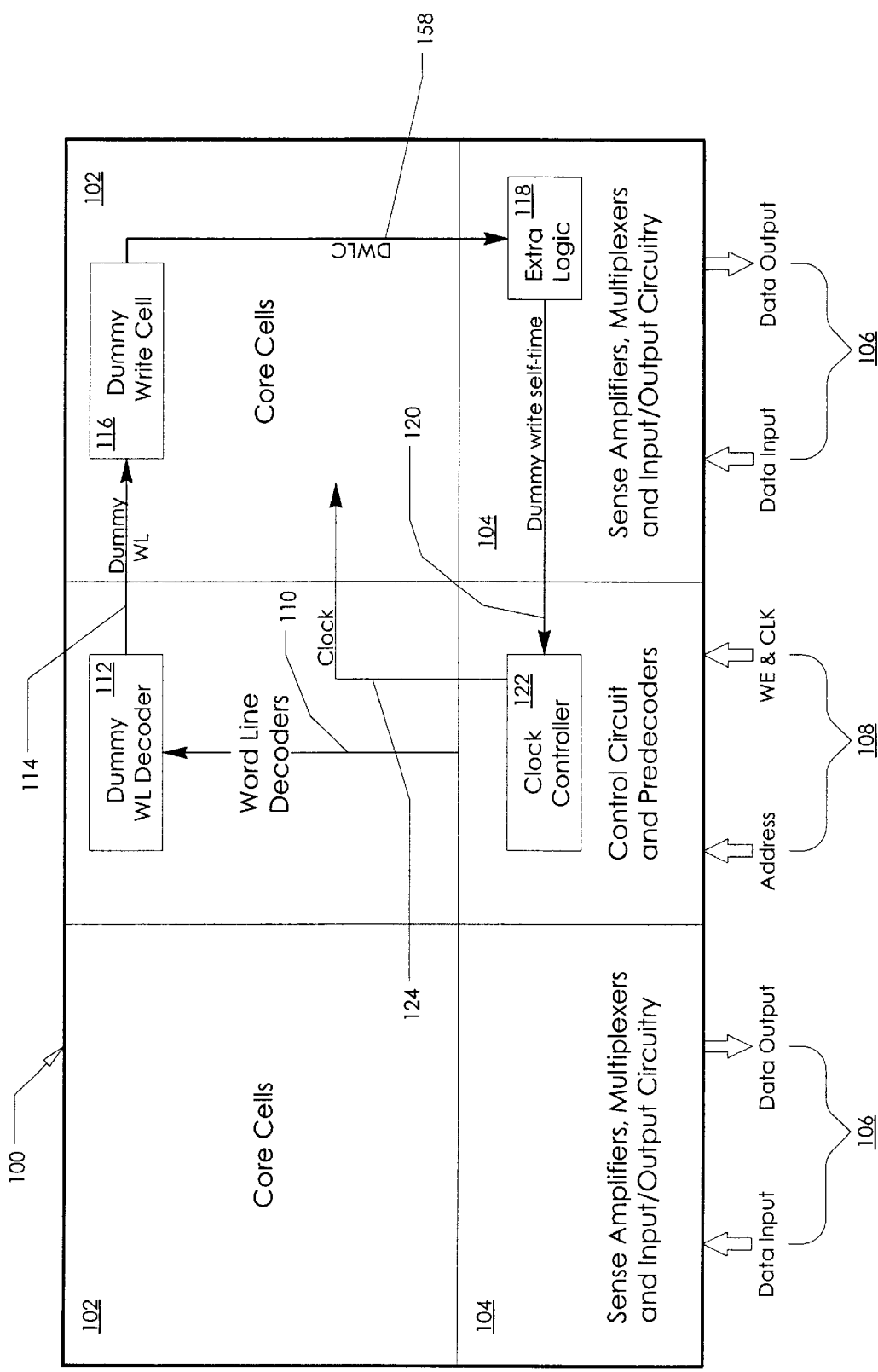
FIG. 3 illustrates the physical layout of a memory device embodying the circuit and method disclosed herein.

FIG. 3 represents the physical layout for an embodiment of the circuit and method disclosed herein. The memory device 100 is arranged as two arrays of memory cells 102 on either side of the semiconductor die, with control circuitry in the middle. Note that this is a typical configuration for a memory device, used here for illustrative purposes. Also note that, although the memory device is symmetrically structured, certain components and connections shown in the right half of the memory array are omitted from the left half for simplicity. The circuit and method disclosed herein should not be construed as limited to this configuration, but are broadly applicable to various memory topologies. Sense amplifiers, I/O circuitry, etc. 104 associated with each of the arrays of cells mediate the transfer of data to and from the memory cells via data inputs and outputs 106. Similarly, the control circuitry receives address, write enable and clock signals 108, which control the access to particular memory locations and the timing of data transfers.

Clock controller 122 within the control circuit block activates/deactivates the sense amplifiers, initiates the pre-charge interval for both read and write memory accesses, and distributes a clock signal 124 to the memory cells. In a typical embodiment, the sense amplifiers may be transistor pairs configured as a differential amplifier fed by a common current source. Such an amplifier may be disabled to reduce power consumption by switching off the current source. The clock 124 and various other active circuitry may be temporarily disabled to conserve power during periods when the memory is not being accessed. When a memory write takes place, word line decoders 110 select specific rows of memory cells by activating corresponding word lines in the memory array 102. A series of word line decoders are connected to a write path or conductor. The dummy word line decoder 112 driving dummy word line 114 is connected to the write path further than the other word line decoders 110 from the control circuit 122 which initiates a word line address. Since it is at the end of the write path, dummy word line 114 will not become active until all the other word lines in that write path have become active. The dummy word line 114 drives dummy write cell 116, which is based on an actual memory cell and has similar timing characteristics. The dummy write cell 116 receives an active word line address and toggles completion of the write access, as described below. Extra logic 118 detects the write access completion from the dummy write cell 116, via DWLC signal 158; it responds by signaling the clock controller 122 over dummy write self-time line 120, and resetting the dummy write cell 116.

Figure 4:
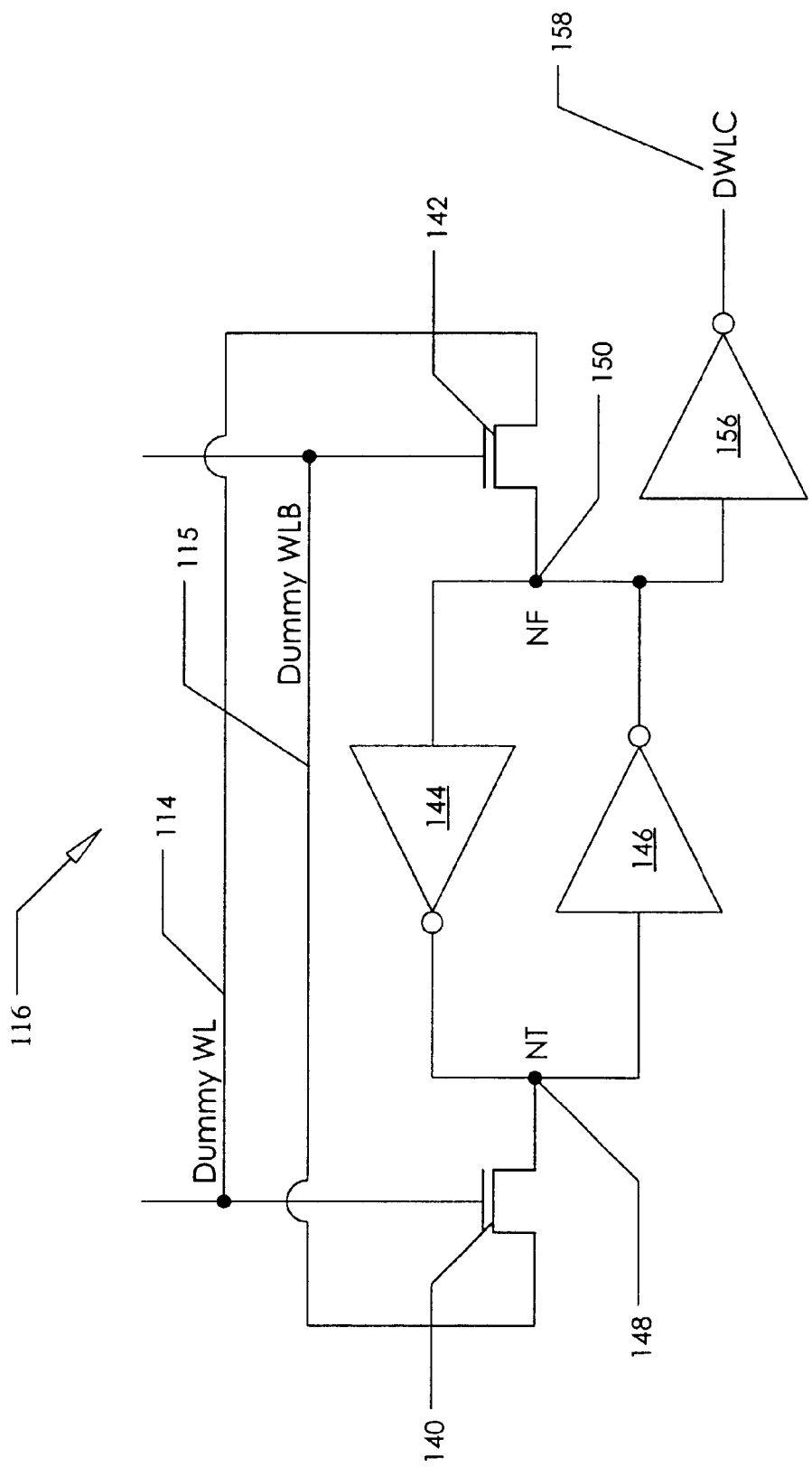
FIG. 4 represents an embodiment of a dummy write cell.

FIG. 4 represents an embodiment of the dummy write cell (item 116 in FIG. 3). As stated above, the dummy write cell circuitry is adapted from the circuitry for a standard memory cell (for example, bi-stable latch circuitry 140–146 in FIG. 4 is configured similarly to items 10, 12, 18 and 20 in FIG. 1). Transistor switches 140 and 142 connect word lines Dummy WL 114 and Dummy WLB 115 to the cross-coupled inverter pair 144 and 146. The logic state of inverter 144 appears at NT ("normally true") node 148, while that of inverter 146 appears at NF ("normally false") node 150. The dummy write cell is structurally identical to a usable memory cell and operates (i.e., has the same response time) as a usable memory cell. The operation of the dummy write cell is as follows.

Initially, NT node 148 is at logic level "1." At the start of a write access, Dummy CWL 114 goes to logic level "1" and Dummy WLB 115 goes to logic level "0." Since switch 140 is closed, NT node 148 is driven to logic level "0." Inverter 146 inverts this logic level, forcing NF node 150 to a logic level "1." Inverter 156 inverts the logic "1" at node NF, creating a logic level "0" on output DWLC 158. (The purpose of the DWLC signal is discussed below.) At the conclusion of the write access, the word line Dummy WL 114 returns to a logic "0," while Dummy WLB 115 goes to logic "1." Transistor switch 140 is opened, and switch 142 closes. This connects the logic "0" on Dummy WL 114 to the input of inverter 144, which generates a logic "1" at NT node 148. Complementary node 150 then returns to a logic level "0," while output DWLC 158 returns to logic level "1." Note that the dummy write cell is now restored to its state prior to the write access.

Figure 5:
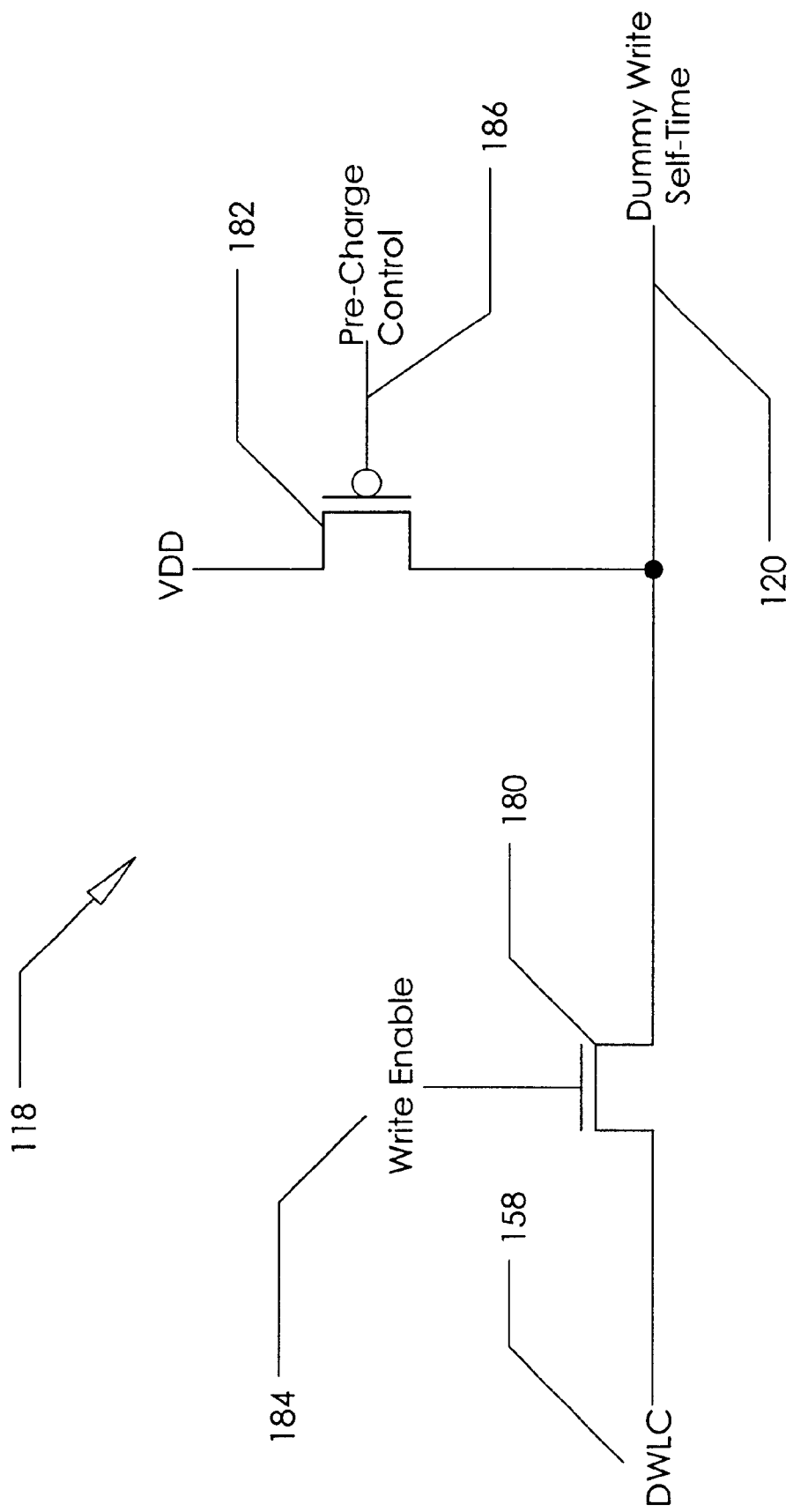
FIG. 5 represents an embodiment of extra logic supporting a dummy write cell.

FIG. 5 shows an embodiment of the extra logic (item 118 in FIG. 3). The extra logic contains two transistor switches 180 and 182, controlled by the write enable 184 and pre-charge 186 control signals, respectively. During a write access, write enable signal 184 is at logic level "1," closing switch 180, and connecting DWLC (item 158 in FIGS. 3 and 4) to the dummy write self-time 120 signal line (item 120 in FIG. 3). At the same time, the pre-charge control signal 186 goes to a logic "1" level, turning off transistor 182 and disconnecting the dummy write self-time line 120 from the positive supply voltage. As described above in connection with FIG. 4, when a simulated write access occurs in the dummy write cell, DWLC transitions from a logic "1" to a logic "0." Since transistor switch 180 is closed, this causes the dummy write self-time line 120 to be pulled down to a logic "0," as well.

The high-to-low transition of the dummy write self-time signal 120 informs the clock controller (item 122 in FIG. 3) that the write access has completed. The clock controller then terminates the write cycle, by turning off the dummy word line and its complement (Dummy WL 114 and Dummy WLB 115, in FIG. 4) and enabling pre-charge (i.e., setting the pre-charge control line 186 to a logic "0"). As explained above, this resets the dummy write cell, preparing it for the next write access. Advantageously, various active circuitry within the memory device, such as the memory clock, write drive, word lines, etc., may also be temporarily disabled at this point to reduce power consumption.

Since the write enable signal (item 184 in FIG. 5) is active only during a write access, read access timing is unaffected by the self-time circuitry. However, complications arise in situations involving combined read/write memory accesses. A device accessing the memory over an 8-bit wide data bus for example, may need to write 3 bits while reading the other 5 bits. If the timing for such an access were determined by the self-time circuitry described above, the read cycle could be prematurely terminated (since a read access typically takes more time to complete than a write). However, such cases may be easily dealt with through the addition of logic combining the write self-time circuit output with that of conventional self-time circuitry (which is based on the read access time). The combined self-time circuitry would not terminate the memory cycle until the completion of the read access. On the other hand, if the port is used strictly as read or write the combined self-time logic would terminate the memory cycle at the direction of the respective read or write self-time circuitry.

The circuit and method disclosed herein represent an improved self-time scheme for write operations in a semiconductor memory device. By optimizing write cycle timing, faster operation of the memory device can be obtained than with conventional self-time schemes. Advantageously, write cycle timing is independent of the read cycle timing, and does not rely on the memory clock. In a memory device utilizing the present circuit and method, the write cycle time is typically equal to or smaller than the read cycle time, representing a substantial reduction in the overall memory cycle time. Furthermore, this circuit and method are readily incorporated into typical memory devices, and would occupy relatively little additional semiconductor die area.

Further modifications and alternative embodiments of various aspects of the invention will be apparent to those skilled in the art in view of this description. For example, although the exemplary embodiments discussed herein have focused on SRAM memory devices, it should be obvious that the circuit and method disclosed herein may be applied to various types of memory devices and technologies, including dynamic random access memory (DRAM), content addressable memory (CAM), etc. It is intended that the following claims be interpreted to embrace all such modifications and changes and, accordingly, the specification and drawings are to be regarded in an illustrative rather than a restrictive sense.

What is claimed is:

1. A memory, comprising:
   a plurality of sense amplifiers in communication with a plurality of memory cells;
   a conductor coupled between a control circuit and a plurality of word line decoders; and
   a dummy word line decoder coupled to the conductor at a point further than said plurality of word line decoders are coupled to the conductor for signaling completion of a data transfer into the memory and for terminating power consumption within sense amplifiers.

2. The memory as recited in claim 1, wherein the dummy word line decoder is substantially identical in structure and operation as each of said plurality of word line decoders.

3. The memory as recited in claim 1, further comprising a dummy memory cell coupled to a word line furthest from the dummy word line decoder than any other of the plurality of memory cells coupled to said word line.

4. The memory as recited in claim 1, wherein the dummy memory cell is coupled to the dummy word line decoder for producing a completion signal noting the completion of the data transfer into the memory, and wherein the dummy memory cell is substantially identical in structure and operation to each of said plurality of memory cells.

5. The memory as recited in claim 1, wherein the memory device further comprises a plurality of bit lines, and wherein the completion signal produced from the dummy memory cell signifies completion of a write access to any of the plurality of memory cells, and initiates pre-charge to any of the plurality of bit lines.

6. The memory as recited in claim 1, wherein said signaling completion of the data transfer into the memory and terminating power consumption within sense amplifiers occur substantially concurrently and prior to the completion of a clock cycle to the plurality of memory cells.

7. The memory as recited in claim 1, wherein the memory is embodied upon a singular substrate to form at least a portion of an integrated circuit.

8. The memory as recited in claim 4, wherein the dummy memory cell changes its logic state coincident with the data transfer into the memory and is restored to its original logic state coincident with the completion signal.

9. The memory as recited in claim 1, wherein a data transfer into the memory and a data transfer out of the memory may occur simultaneously.

10. The memory as recited in claim 9, further comprising a controller adapted to receive a first completion signal coincident with completion of the data transfer into the memory and a second completion signal coincident with completion of the data transfer out of the memory, and adapted to halt the clock cycle upon receipt of both completion signals.

* * * * *